(12) United States Patent
Tran et al.

(10) Patent No.: US 6,184,718 B1
(45) Date of Patent: *Feb. 6, 2001

(54) DYNAMIC LOGIC CIRCUIT (75) Inventors: Dzung Joseph Tran; Mark Warren Acuff, both of Hillsboro, OR (US)

(73) Assignee: Translogic Technology, Inc., Beaverton, OR (US)

( * ) Notice: Under 35 U.S.C. 154(b), the term of this patent shall be extended for 0 days.

This patent is subject to a terminal disclaimer.

(21) Appl. No.: 09/348,994

(22) Filed: Jul. 7, 1999

Related U.S. Application Data (63) Continuation-in-part of application No. 09/228,149, filed on Jan. 11, 1999, now abandoned, which is a continuation of application No. 08/779,012, filed on Dec. 20, 1996, now Pat. No. 5,859,547.

(51) Int. Cl.[7] .................................................. H03K 19/003

(52) U.S. Cl. ............................... 326/121; 326/98; 326/95

(58) Field of Search .................................. 326/98, 93, 95, 326/121

(56) References Cited

U.S. PATENT DOCUMENTS

| | | | |
|---|---|---|---|
| 4,569,032 | 2/1986 | Lee | 364/787 |
| 4,692,637 | 9/1987 | Shoji | 307/443 |
| 4,700,086 | 10/1987 | Ling et al. | 307/443 |
| 4,849,658 | 7/1989 | Iwamura et al. | 326/93 |
| 4,899,066 | 2/1990 | Aikawa et al. | 326/93 |
| 5,008,569 | 4/1991 | Roy | 307/465 |
| 5,023,486 | 6/1991 | Gongwer | 307/465 |
| 5,070,262 | 12/1991 | Hashimoto | 307/475 |
| 5,208,489 | 5/1993 | Houston | 307/451 |
| 5,402,012 | 3/1995 | Thomas | 326/97 |
| 5,453,708 | 9/1995 | Gupta et al. | 326/98 |
| 5,530,380 | 6/1996 | Kondoh | 326/98 |
| 5,859,547 * | 1/1999 | Tran et al. | 326/98 |
| 5,936,449 * | 8/1999 | Huang | 326/98 |
| 6,011,410 * | 1/2000 | Kim et al. | 326/98 |

OTHER PUBLICATIONS

Goncalves et al., "NORA: A Racefree Dynamic CMOS Technique for Pipelined Logic Structures," *IEEE Jour. Sol–Sta Cir*, vol. Sc–18, No. 3, pp. 261–266 (Jun. 1983).

Krambeck et al., "High–Speed Compact Circuits with CMOS," *IEEE Jour. Sol–Sta Cir*, vol. SC–17, No. 3, pp. 614–619 (Jun. 1982).

Lee et al., "Zipper CMOS," *IEEE Circuits and Devices Magazine*, vol. 2, pp._10–16 (May 1986).

Weste et al., "5.4.7 CMOS Domino Logic," Chap. 5, *Principles of CMOS VLSI Design: a systems perspective*, Library of Congress, 2$^{nd}$ ed., pp. 308–344 (1993).

* cited by examiner

*Primary Examiner*—Tan T. Nguyen
(74) *Attorney, Agent, or Firm*—Klarquist Sparkman Campbell Leigh & Whinston, LLP.

(57) ABSTRACT

A dynamic logic circuit that uses substantially constant power and that has substantially constant propagation delay, independent of the number of inputs the dynamic logic circuit contains. In one embodiment of the circuit, an evaluation transistor is positioned between a precharge transistor and a dynamic logic block. The evaluation transistor separates a precharge node from the logic block during a precharge clock phase so that the logic block is not charged. A delay coupled to the precharge transistor allows the precharge transistor to remain activated during a portion of an evaluation clock phase to overcome any effects of charge-sharing between the precharge node and the dynamic logic block. Because the evaluation transistor separates the logic block from the precharge node, the precharge node can be charged independently of the number of inputs present in the dynamic logic block.

20 Claims, 7 Drawing Sheets

FIG. 4A
CLOCK SIGNAL

Precharge Phase

Evaluation Phase

FIG. 4B
DELAYED CLOCK SIGNAL AT GATE OF PRECHARGE TRANSISTOR

PRECHARGE TRANSISTOR ACTIVATED

400

PRECHARGE TRANSISTOR DEACTIVATED

402

FIG. 4C
INPUT SIGNALS

FIG. 4D
CLOCK SIGNAL AT GATE OF EVALUATION TRANSISTOR

EVALUATION TRANSISTOR DEACTIVATED

EVALUATION TRANSISTOR ACTIVATED

FIG. 4E
CHARGING OF DYNAMIC LOGIC BLOCK DURING PORTION OF EVALUATION PHASE

DYNAMIC LOGIC CIRCUIT

RELATED APPLICATION DATA

This application is a continuation-in-part of U.S. patent application Ser. No. 09/228,149 filed Jan. 11, 1999 abandoned, which is a continuation of U.S. patent application Ser. No. 08/779,012, filed Dec. 20, 1996, now U.S. Pat. No. 5,859,547.

FIELD OF THE INVENTION

This invention relates generally to electronic circuits and, more particularly, relates to implementing logic functions using a high-speed dynamic logic circuit.

BACKGROUND OF THE INVENTION

Dynamic circuits have achieved widespread use because they require less silicon area and have superior performance over conventional static circuits. Unlike static circuits, dynamic circuits store data in the form of charge that dissipates in a short period of time due to leakage current. Consequently, dynamic circuits must periodically refresh the charge in order to properly retain data. A well-known dynamic circuit is a dynamic random access memory (DRAM) that stores data on charged capacitors.

Figure 1A:
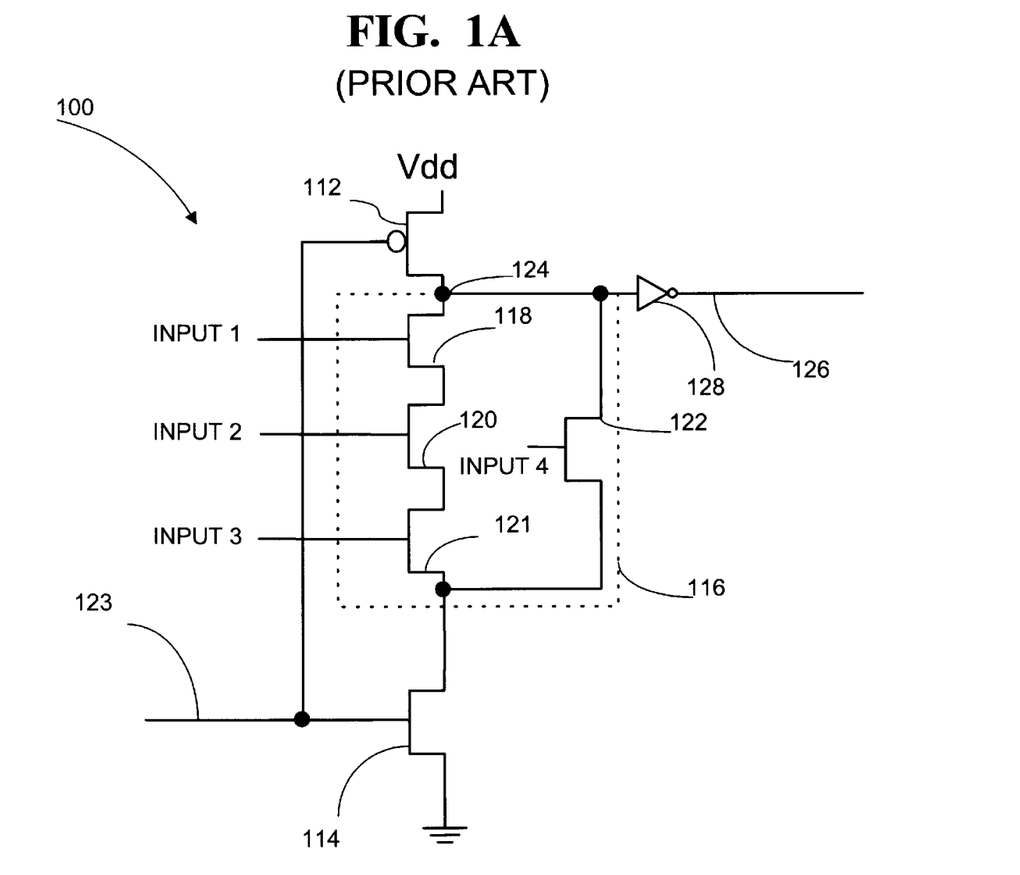
FIG. 1A is a schematic diagram of a known dynamic logic circuit implementing a logic function.

Dynamic circuits can also be used to implement logic functions. An example of a dynamic logic circuit is shown in FIG. 1A, where a four-input logic function is implemented. A circuit 100 includes a precharge transistor 112 tied to power (Vdd), an evaluation transistor 114 tied to ground and a logic block 116 (shown in dashed lines) coupled between the precharge and evaluation transistors. Logic block 116 has a group of three input transistors 118, 120, 121 coupled in series and one input transistor 122 coupled in parallel across the other input transistors. A clock signal path 123 is coupled to the precharge and evaluation transistors.

Figure 1B:
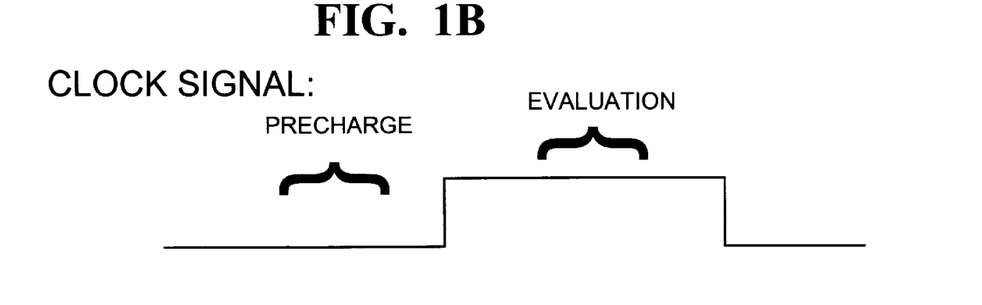
FIG. 1B is a timing diagram of a clock signal having a precharge and an evaluation phase.

FIG. 1B shows a waveform of a clock signal on the path 123. The signal has precharge And evaluation portions in its clock cycle which correspond to precharge and evaluation phases of the circuit. During the precharge phase, transistor 112 is activated (operating in saturation), charging a precharge node 124 and the logic block 116 to a logic high voltage level. Conversely, transistor 114 is inactive (substantially turned off) during the precharge phase. With precharge node 124 at a high voltage level, a primary output 126 is at a logic low voltage level because inverting buffer 128 inverts the output of node 124.

During the evaluation phase, the evaluation transistor 114 is active and the precharge transistor is inactive. If each serially coupled input transistor 118, 120, 121 in logic block 116 is activated or if input transistor 122 is activated, then the logic block is said to be "conducting" (substantially a short circuit), and the evaluation transistor pulls the precharge node 124 and the logic block 116 low. Otherwise, the precharge node and the logic block remain at their precharged level.

Each transistor in the logic block has an associated capacitance (not shown). The precharge transistor 112 must be large enough to charge all of the transistors in the logic block 16 during the precharge phase. If the precharge transistor is too small, the capacitance of the transistors in the logic block may absorb enough charge to prevent the voltage on node 124 from rising to a high voltage level.

The more sophisticated the circuit, the more input transistors are needed in the logic block, and the larger the precharge transistor must be in order to overcome the capacitance of the logic block. Increasing the size of the precharge transistor increases the area and power used by the circuit. Moreover, increasing capacitance of the logic block increases the propagation delay (i.e., slows the speed) of the circuit. The speed of the circuit is determined by how fast the evaluation transistor can remove charge from the precharged logic block and the precharge node. The more inputs in the logic block, the greater the charge that the evaluation transistor must remove, and, hence the slower the circuit. Thus, power, area and speed are all related to the number of inputs to the circuit. The greater the number of inputs, the greater the amount of power needed to run the circuit, the greater the area the circuit uses, and the greater the circuit's propagation delay.

Using the circuit of FIG. 1, designers must weigh the advantages of including new features into a circuit against the increase in power, area and propagation delay as a result of the new features.

It is, therefore, desirable to have a circuit that has constant power and propagation delay regardless of the number of inputs to the dynamic logic block.

Figure 2:
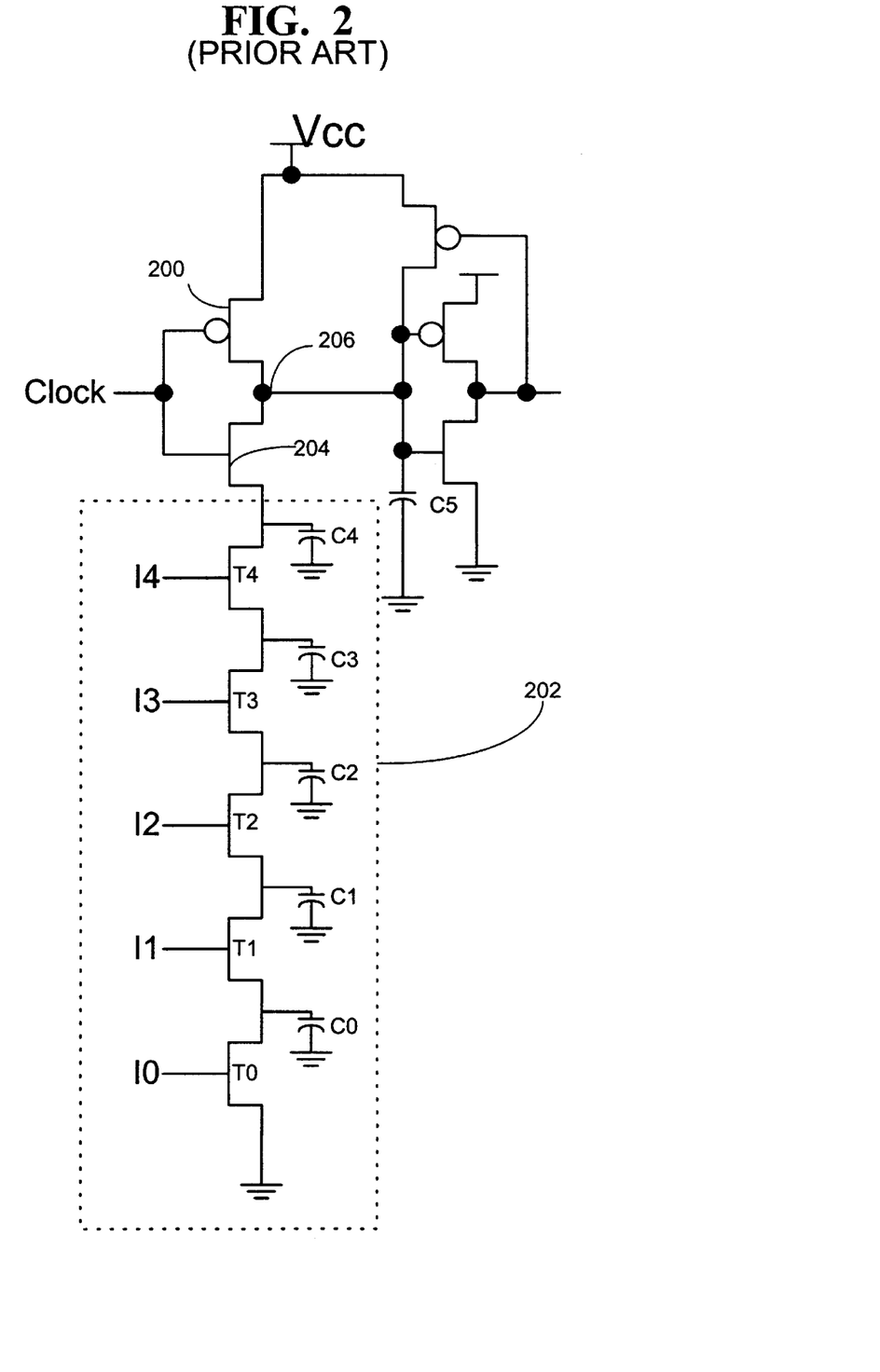
FIG. 2 is a schematic diagram of a known dynamic logic circuit that is problematic due to charge-sharing between a precharge node and a logic block during the evaluation phase.

FIG. 2 shows a known dynamic logic circuit that attempts to overcome the problems of the FIG. 1 circuit. A precharge transistor 200 is isolated from a logic block 202 by an evaluation transistor 204. Each transistor $T_0$–$T_4$ in the logic block 202 has an associated capacitance that is represented by capacitors $C_0$–$C_4$. A precharge node 206 also has capacitance associated with it as represented by a capacitor $C_5$. Unlike FIG. 1, the precharge transistor 200 does not charge the logic block 202 to an appropriate high voltage level during the precharge phase. Instead, the evaluation transistor 204 is off during the precharge phase, isolating the precharge transistor from the logic block. The precharge transistor of FIG. 2 may be smaller, consequently, than the precharge transistor in the circuit of FIG. 1, thereby saving power and area.

Nonetheless, the circuit of FIG. 2 is generally considered a poor design because charge-sharing between the logic block and the precharge node during the evaluation phase can cause the precharge node to undesirably go low. See *Principles of CMOS VLSI Design: A System Perspective*, 2nd Edition, by Neil Weste and Kamran Eshraghian, FIG. 5.37(a). For example, assume the inputs $I_1$–$I_4$ are high (transistors $T_1$–$T_4$ are active), while input $I_0$ is low (transistor $T_0$ is inactive). When the evaluation phase begins, all of the charge associated with capacitor $C_5$ (stored during the precharge phase) is shared with capacitors $C_1$–$C_4$ because the elevation transistor allows current to flow therebetween. Given the inputs, the output is supposed to be a logic low (since $T_0$ is inactive). Instead, the capacitors $C_1$–$C_4$ absorb enough charge from capacitor $C_5$ that the circuit output erroneously goes high. The larger the number of inputs, the more charge-sharing that occurs and the more likely the circuit will improperly operate.

An objective of the invention, therefore, is to provide an improved dynamic logic circuit that overcomes the deficiencies of the prior art.

SUMMARY OF THE INVENTION

The present invention provides a dynamic logic circuit that has increased speed and reduced power. Moreover, particularly for cells with higher drive capacity, the power and speed of the circuit are substantially constant, for a wide range of inputs the circuit contains. The circuit also allows for a precharge transistor that is a substantially constant size, regardless of the number of inputs.

In one embodiment, a dynamic logic circuit includes a precharge transistor for precharging a precharge node of the circuit to a predetermined voltage level, such as a logic high or a logic low. A logic block contains one or more input transistors that receive input signals to the dynamic logic circuit. An evaluation transistor is positioned between the logic block and the precharge transistor and electrically uncouples the logic block from the precharge node during a precharge phase so that the precharge node is unaffected by the capacitance of the logic block. A delay is coupled to the precharge transistor and ensures that the precharge transistor is activated for at least a portion of an evaluation phase to charge the logic block. Thus, charge-sharing between the precharge node and the dynamic logic block is overcome by an influx of additional charge at the start of the evaluation phase.

The delay can be accomplished a number of ways, including transmission line delays or RC delays. The delay can also be a buffer, such as a pair of inverters.

In another aspect of the invention, an anti-float device, such as a latch, is used to prevent the output node from floating or otherwise losing the current state of the circuit.

In yet another aspect of the invention, the dynamic logic circuit may provide a buffered clock signal used to drive subsequent stages of dynamic logic.

In still a further aspect of the invention, the dynamic logic circuit may provide both inverted and non-inverted outputs that may be used by subsequent dynamic logic stages.

The circuit according to the invention has several advantages. The precharge transistor is isolated from the logic block by the evaluation transistor. Consequently, as the number of inputs of the logic block increases, the precharge transistor is minimally affected by any increase in capacitance of the logic block. Moreover, the electrical uncoupling of the precharge node from the logic block allows the precharge transistor to be a constant size for a wide range of inputs the circuit contains. The precharge transistor only needs to be large enough to charge the precharge node. Still further, power is also saved by only charging the precharge node during the precharge phase, rather than the precharge node and the logic block. Finally, the dynamic logic circuit according to the invention is faster because only the precharge node needs to be pulled to the proper voltage level when the logic block is conducting, rather than the logic block and the precharge node. This allows the speed of the circuit to be fairly constant, for a wide range of inputs.

These advantages and other advantages and features of the invention will become apparent from the following description of a preferred embodiment, which proceeds with reference to the following drawings.

DETAILED DESCRIPTION OF THE PREFERRED EMBODIMENT

Figure 3A:
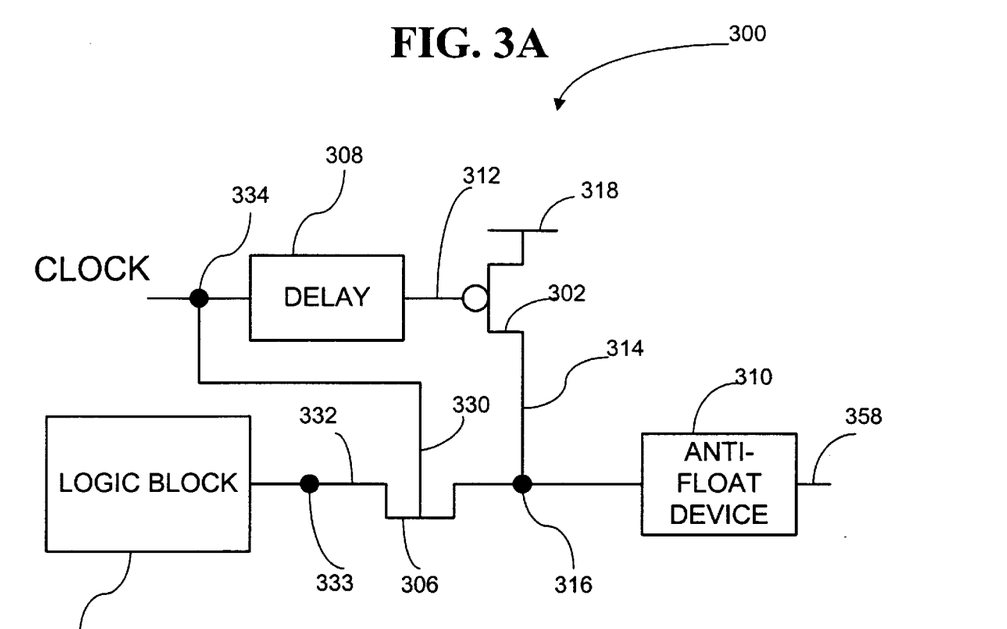
FIG. 3A is a schematic diagram of a dynamic logic circuit according to the invention, including a logic block, a delay and an anti-float device.

FIG. 3A shows a dynamic logic circuit 300 according to the present invention. The dynamic logic circuit 300 includes a precharge transistor 302, a logic block 304, and an evaluation transistor 306 positioned between the logic block and precharge transistor. The dynamic logic circuit 300 also includes a delay 308 and an anti-float device 310.

The precharge transistor 302 is a P-channel MOS transistor having a gate 312 and a source-to-drain path 314. The source-to-drain path 314 is coupled at one end to a precharge node 316 and at an opposed end to a positive supply voltage (e.g. 5-volt supply) denoted by horizontal line 318. The P-channel transistor is activated when a logic low voltage level is applied to the gate 312. Conversely, the precharge transistor is deactivated when the voltage level on gate 312 is a logic high.

The evaluation transistor 306 includes a gate 330 and a source-to-drain path 332. The source-to-drain path is coupled at one end to a logic-block output node 333 and at an opposed end to the precharge node 316. The gate 330 is coupled to a clock node 334 for receiving a clock signal. The evaluation transistor is an N-channel MOS transistor and, as such, is activated when a logic high voltage level is applied to the gate 330. Conversely, the N-channel transistor is deactivated when a logic low voltage level is applied to the gate.

Figure 4A:
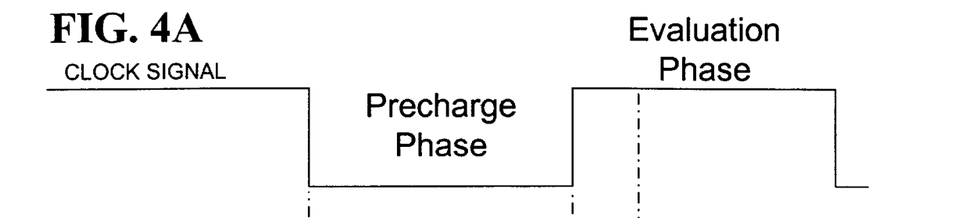
FIGS. 4A–4E show timing diagrams of the dynamic logic circuit of FIG. 3A.
Figure 4B:
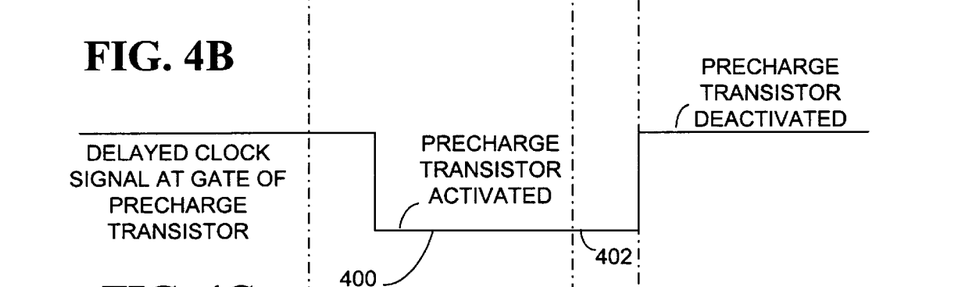

A clock signal applied to the clock node 334 switches between logic low and logic high voltage levels, as depicted in FIG. 4B. During an evaluation phase of the clock cycle, the evaluation transistor 306 is activated. As a result, the evaluation transistor 306 electrically couples the precharge node 316 and the logic-block output node 333 so that charge can flow therebetween. During the precharge portion of the clock cycle, the evaluation transistor is deactivated, and the nodes 316 and 333 are electrically uncoupled so that no charge can pass therebetween (except for leakage current through the evaluation transistor).

The logic block 304 is so named because it determines the logical function of the dynamic logic circuit 300. The logic block includes one or more input transistors that can be arranged in any configuration to provide a desired logic function. An example of a logic block 304 is shown in FIG. 3D. The logic block is shown with two input transistors 335 and 336, each having an input signal (Input O and Input 1, respectively) coupled to their gates. The input transistors are coupled between the logic-block output node 333 and a negative supply voltage, in this case, ground 338.

With the evaluation transistor off, the node 333 can have two states. In one state, the node 333 is floating (meaning it has no defined voltage level). The node 333 floats hen the input signals are such that no electrical path exists between the node 333 and the ground terminals 338. In a second state, the node 333 is grounded or is a logic low voltage level. In the second state, the input signals are such that an electrical path is conducting from ground 338 to the node 333.

The transistors can be arranged all in parallel, all in series, or a series/parallel combination. One input transistor is usually provided in the logic block for each input signal. Consequently, more complicated functions with more input signals require logic blocks with additional input transistors.

The delay 308 is coupled between the gate 312 of the precharge transistor 302 and the clock node 334. The delay 308 delays the clock signal so that the signal at the gate 312 of the precharge transistors receives a phase-shifted clock signal.

Figure 3B:
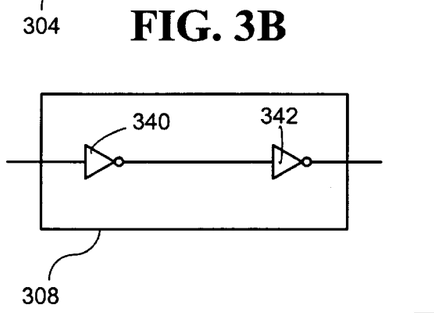
FIG. 3B is a schematic diagram of the delay element of FIG. 3A.

FIG. 3B shows an example of a delay circuit 308 used in the present invention. The delay 308 includes two serially coupled inverters, 340 and 342. The clock signal is delayed by the propagation delay of each inverter. Using the illustrated delay, the clock signal is phase-shifted by about 30 to 200 picoseconds. Although the delay is shown as serially coupled inverters, the delay 308 may also be accomplished using transmission-line delays or RC delays. Other types of delay circuits are well known in the art and may be used. The timing that the delay delays the clock signal varies based on the application and any desired value of delay may be used.

Figure 3C:
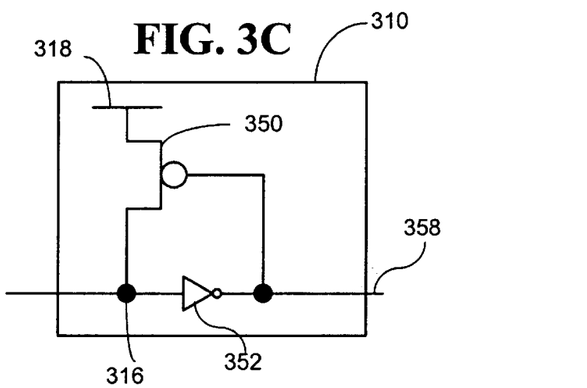
FIG. 3C is a schematic diagram of the anti-float device of FIG. 3A.
Figure 3D:
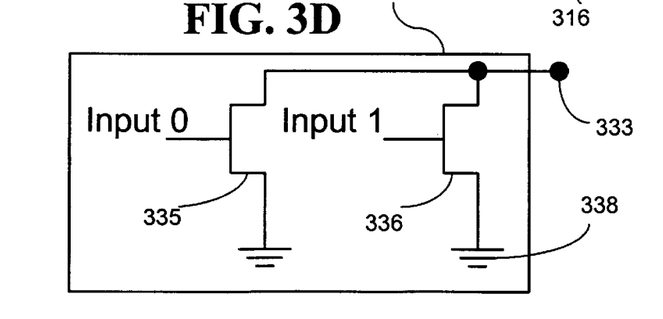
FIG. 3D is a schematic diagram of the logic block of FIG. 3A.

The anti-float device 310 is shown in more detail in FIG. 3C. The anti-float device is optional, meaning it does not necessarily need to be included in the circuit. The anti-float device includes a P-channel transistor 350 having a source-to-drain path coupled at one end to the precharge node 316 and at an opposed end to a positive voltage supply terminal 318. An inverter 352 is coupled between the precharge node and a gate on the P-channel transistor 350. The illustrated anti-float device is an inverting latch that maintains the voltage level on the precharge node 316 when the precharge node has a logic high voltage level thereon. A circuit output 358 is the output of the inverter 352. As a result, the circuit output is an inverted version of the precharge node.

Although the anti-float device is shown as an inverting latch, different types of anti-float devices may be used, including non-inverting latches and flip-flops.

FIGS. 4A–4E show a timing diagram of the circuit of FIG. 3. FIG. 4A shows a clock signal having a precharge phase when the clock signal is a logic low voltage level and an evaluation phase when the clock signal is a logic high voltage level.

Referring to FIGS. 3A and 4B, FIG. 4B shows the delayed clock signal received at the gate 312 of the precharge transistor 302. The delayed clock signal is a phase-shifted version of the clock signal of FIG. 4A. The phase shift corresponds to the length of the delay 308. In the illustrated circuit 300, the delay is equal to the propagation delay through two inverters 340, 342. During portion 400 of the delayed clock signal, the precharge transistor 302 is activated and the evaluation transistor 306 is deactivated. As a result, the precharge node 316 is charged to a logic high voltage level by the current flowing from the positive voltage supply 318 through the source-to-drain path 314 of the precharge transistor. "Charging" refers to substantially equalizing the energy potential on the precharge node to the voltage supply coupled to the source-to-drain path of the precharge transistor. The precharge node may not have the identical energy potential as the voltage supply because of a voltage drop across the precharge transistor. During portion 400 of the delayed clock signal, the evaluation transistor 306 is deactivated, as shown in FIG. 4D. The evaluation transistor electrically uncouples the logic block and the precharge node (so substantially no charge flows therebetween). As a result, the logic-block output node 333 is not charged by the precharge transistor during the portion 400 of the delayed clock signal.

During the portion 402 of the delayed clock, the precharge transistor is activated, and the evaluation transistor is also activated. During the portion 402, the evaluation transistor electrically couples (i.e., charge can flow between) the precharge node and the logic block. Thus, the precharge transistor charges the logic block through the evaluation transistor. This charging of the logic block overcomes the problems shown in the circuit of FIG. 2. In the circuit of FIG. 2, the precharge node loses substantial charge when the evaluation transistor is activated (at the start of the evaluation phase) because of charge-sharing among other transistors in the logic block. This may result in erroneous voltage levels on the precharge node.

By contrast, the circuit of FIG. 3A charges the logic block during a portion of the evaluation phase to overcome any charge-sharing that occurs at the start of the evaluation phase. This charging occurs because the precharge transistor and the evaluation transistor are activated simultaneously for a period of time sufficient for the precharge transistor to properly charge the dynamic logic block.

Figure 4C:
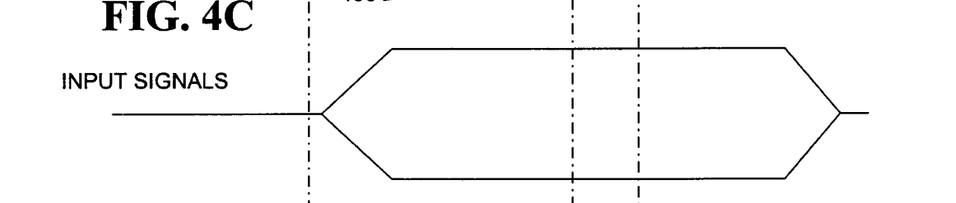
Figure 4D:
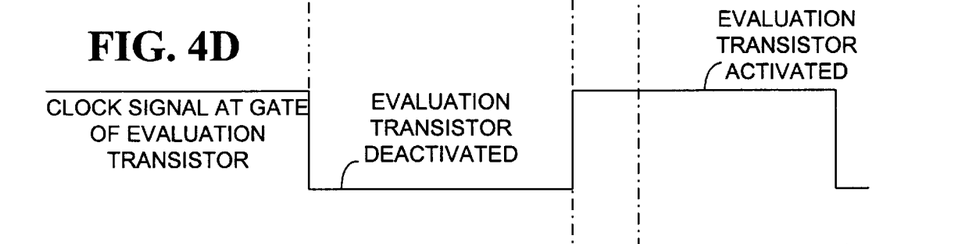

As shown in FIG. 4C, the input signals to the logic block become valid sometime during the portion 400 of the delayed clock signal. Depending upon the input signals and the configuration of the transistors in the logic block 304, the logic-block output node 333 is either floating (i.e., logic block not conducting) or pulled to ground (i.e., logic block conducting). This should be contrasted with the prior art circuit shown in FIG. 1A, where the logic block 116 is also charged during the precharge phase to the same voltage level as the precharge node.

In the circuit of FIG. 3A, if the inputs allow the logic-block output node 333 to be grounded, then at the start of the evaluation phase, only charge on the precharge node 316 needs to be pulled to ground. This allows for a significant speed advantage over the prior art. Additionally, the speed of the circuit is substantially constant for a wide range of inputs to the logic block.

Figure 4E:
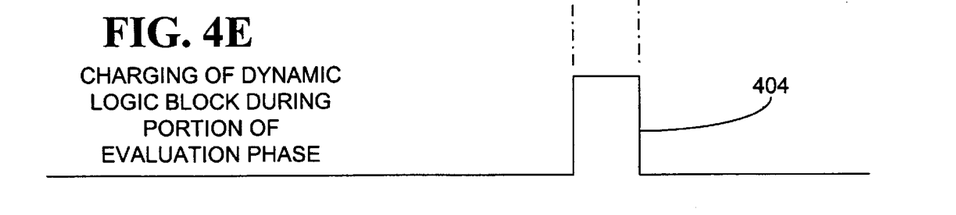

FIG. 4E shows an overlap period 404 during which the precharge transistor and the evaluation transistor are both simultaneously activated. This time is typically between 30 picoseconds (ps) and 200 ps, but any desired value of delay can be used to modify this overlap period. This specific amount of delay depends upon the particular application.

FIGS. 5A–5D show an alternative embodiment of the present invention with a dynamic logic circuit 500 having a precharge transistor 502, a logic block 504 and an evaluation transistor 506. The circuit 500 also includes a delay 508 coupled to a gate of the precharge transistor 502 and an anti-float device 510 coupled between a precharge node 512 and a circuit output 514.

Figure 5A:
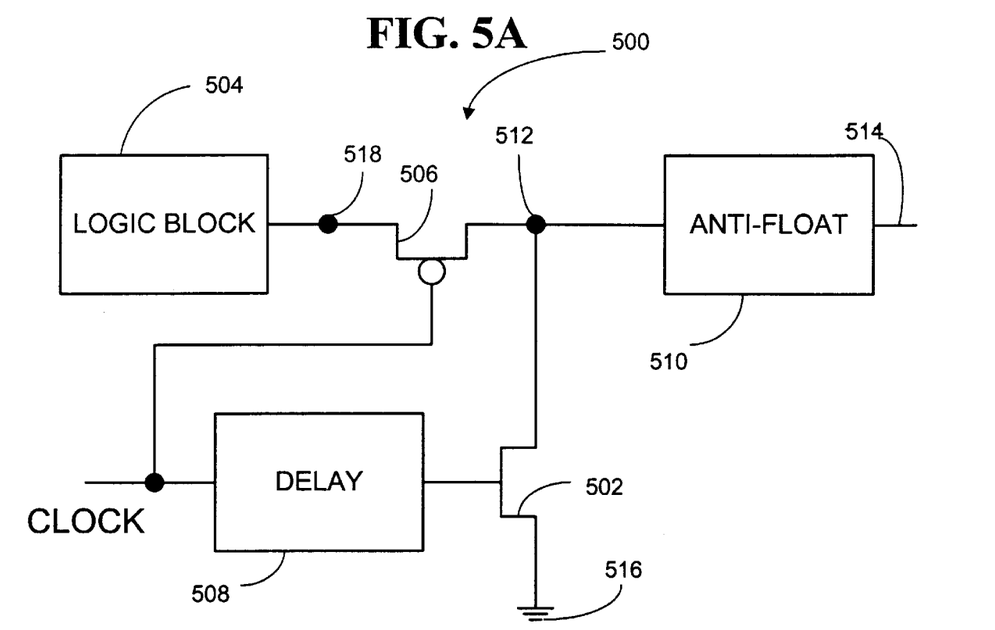
FIG. 5A is a schematic diagram of a second embodiment of a dynamic logic circuit according to the invention, including a logic block, a delay and an anti-float device.

The precharge transistor 502 is an N-channel transistor (rather than P-channel, as in FIG. 3A). Similarly, the evaluation transistor 506 is a P-channel transistor rather than N-channel. The precharge transistor 502 has a source-to-drain path that is connected between the precharge node 512 and a negative supply voltage, shown as ground 516.

The dynamic logic circuit 500 charges the precharge node 512 to a logic low voltage level (e.g., ground) during a precharge phase. In the FIG. 5 circuit, the precharge phase occurs when the clock signal is a logic high, and the evaluation phase occurs when the clock signal is a logic low.

A logic-block output node 518 has two potential states. Either the node is floating, or if the input signals to the logic block allow the logic block to conduct, then the node 518 is a logic high voltage level.

Because of delay 508, the precharge transistor 502 and evaluation transistor 506 are activated simultaneously for a short period of time during the evaluation phase. This allows the precharge transistor 502 to charge the logic block 504, in this case to a low voltage level.

Figure 5B:
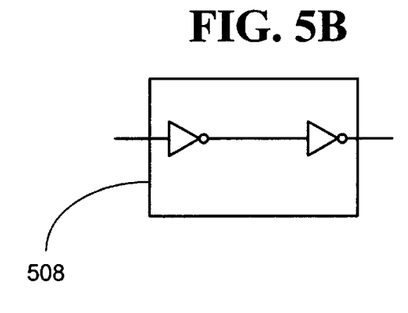
FIG. 5B is a schematic diagram of the delay of FIG. 5A.

FIG. 5B shows the delay 508 in more detail. Like FIG. 3B, the delay includes two inverters serially coupled together. Other possible delays have already been described in relation to FIG. 3B.

Figure 5C:
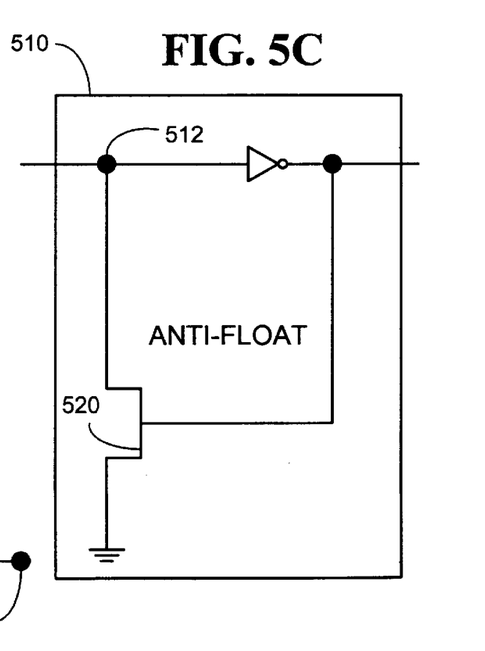
FIG. 5C is a schematic diagram of the anti-float device of FIG. 5A.

FIG. 5C shows the anti-float circuit 510 in more detail. The circuit is substantially similar to the circuit shown in FIG. 3C, but an N-channel transistor 520 is used as a pull-down transistor, rather than a P-channel pull-up transistor, as shown in FIG. 3C. The anti-float circuit 510 keeps the precharge node 512 to a logic low voltage level unless the logic block drives the precharge node high, in which case the pull-down transistor switches off, allowing the precharge node 512 to remain at a high voltage level.

Figure 5D:
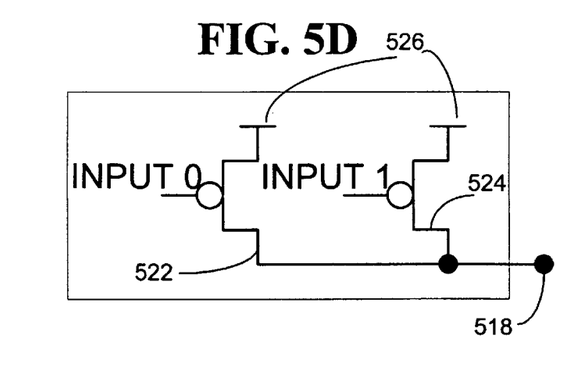
FIG. 5D is a schematic diagram of the logic block of FIG. 5A.

FIG. 5D shows the logic block 504 in greater detail. In this case, the input transistors, such as input transistors 522 and 524, have a source-to-drain path coupled between a positive voltage supply 526 and the logic-block output node 518.

Figure 6A:
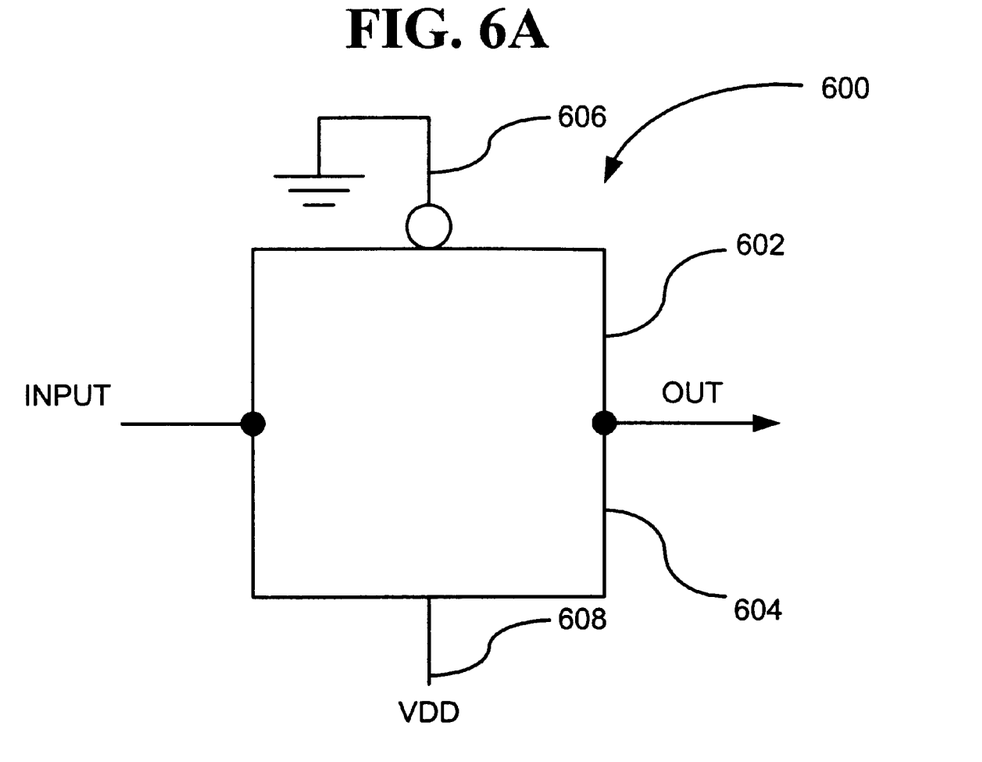
FIGS 6A and 6B show circuit diagrams of alternative delays that may be used with the invention.
Figure 6B:
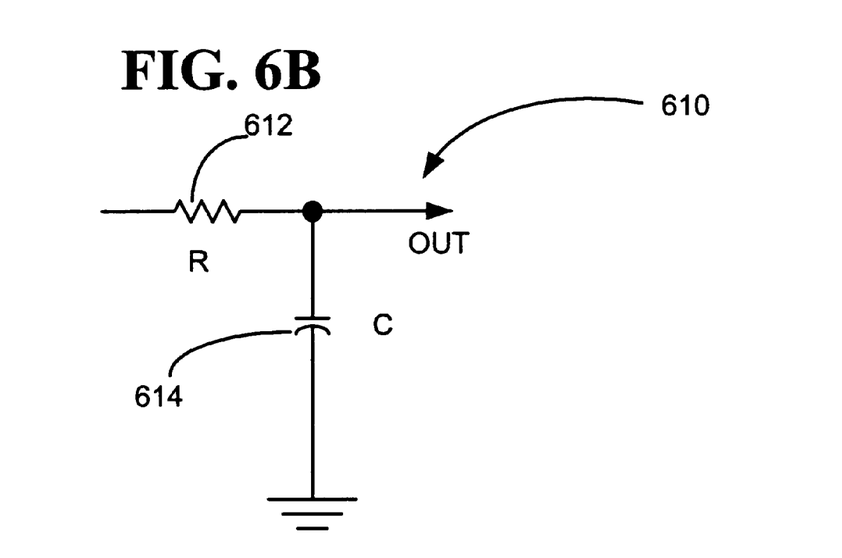

FIGS. 6A and 6B show additional circuits that can be used for the delay circuits 308, 508 described above. FIG. 6A shows the delay as a transmission gate 600. The transmission gate 600 includes a P-type transistor 602 and an N-type transistor 604 having their source-to-drain paths coupled together. Both the P-type and N-type transistors 602, 604 are simultaneously activated by having gates 606, 608 tied to ground and power.

FIG. 6B shows the delay as including a circuit 610 having a resistor 612 and a capacitor 614 coupled together. Those skilled in the art will recognize that the amount of delay can be modified by changing the values for resistor 612 and capacitor 614.

Those skilled in the art will recognize that a wide variety of delay circuits can be used to implement the invention. Thus, the invention should not be limited to the particular type of delay used.

Figure 7A:
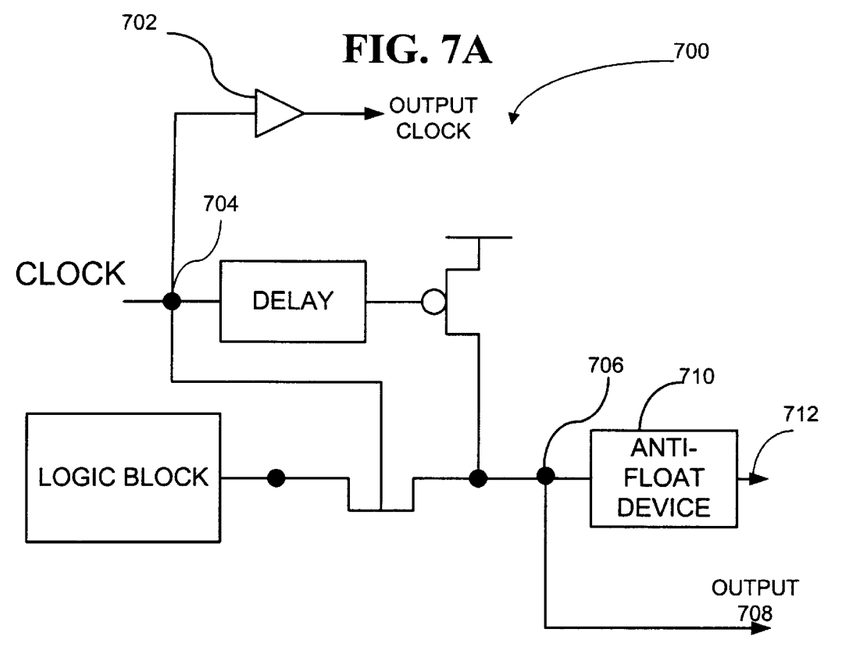
FIGS. 7A and 7B are schematic diagrams of third and fourth embodiments of the dynamic logic circuit according to the invention, including an additional non-inverted output and a buffered clock output.

FIG. 7A shows a circuit 700 similar to that of FIG. 3A with two additional features. One feature includes a buffer 702 tied to an input clock node 704. Buffer 702 provides an output clock that may be used to drive subsequent stages in dynamic logic circuit. The buffer 702 ensures that the clock signal maintains proper voltage levels to drive the subsequent stages and delays the clock signal so that the inputs to the subsequent stages have sufficient setup time.

A second feature is an output node 706 that provides a non-inverted output 708. An anti-float device 710 may provide an inverted output 712. Thus, outputs 708 and 712 may be complementary outputs that are used as inputs to subsequent stages in a dynamic logic circuit. Although not shown, output 708 can also have an inverter coupled thereto to provide an inverted output.

Those skilled in the art will recognize that the output clock provided by buffer 702 and non-inverted output 708 can be used in combination as shown in FIG. 7A or either can be used independently without the other being included in the circuit.

Figure 7B:
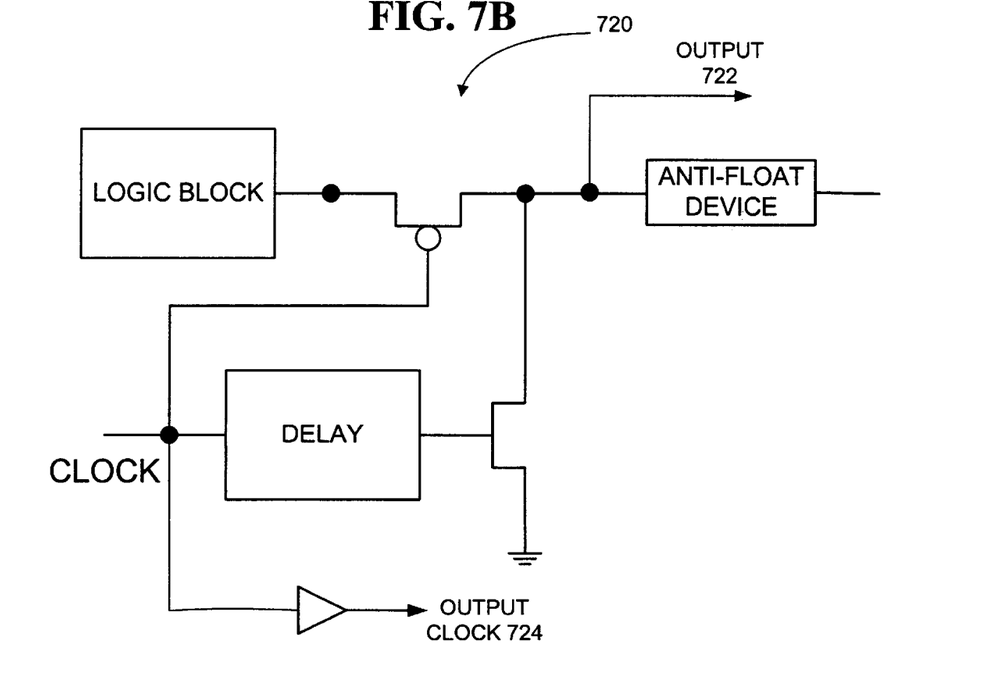

FIG. 7B shows a circuit 720 similar to the circuit 500 of FIG. 5A. The circuit 720 includes a non-inverted output 722 and a buffered clock signal 724, similar to that already described in relation to FIG. 7A. Thus, the description above for FIG. 7A equally applies to the circuit of FIG. 7B.

The circuits shown in the present application have several advantages over prior dynamic logic circuits:

1) The circuit uses substantially constant power for a wide range of inputs to the dynamic logic block. In prior circuits, the more inputs, the more power the circuits use. In the illustrated embodiment of the invention, the evaluation transistor isolates the logic block from the precharge transistor and the precharge node. Consequently, the precharge transistor only charges the precharge node and not the input transistors in the logic block during the precharge phase. The charging of the precharge node requires substantially constant power independent of the number of inputs to the logic block. The word "substantially" is used because power does increase slightly with an increase in inputs. This is due to the brief charging of the logic block during the evaluation phase.

2) The circuit has substantially constant propagation delay, independent of the number of inputs the circuit contains. This is also the result of separation of the dynamic logic block from the precharge node. At the start of the evaluation phase, the logic-block output node is already charged to its proper state. If the logic block is conducting, only the charge on the precharge node needs to be changed. Consequently, the propagation delay of the circuit is substantially constant independent of the number of inputs the circuit contains.

3) The precharge transistor can be sized smaller than precharge transistors in prior circuits. Additionally, the precharge transistor can stay substantially the same size for a wide range of inputs the circuit contains. This is also because of the isolation of the precharge node from the logic block during the precharge phase. The precharge transistor only needs to charge the precharge node. The precharge transistor also briefly charges the logic block, but this has little consequence on the sizing of the precharge transistor (the precharge transistor does increase in size slightly for more inputs, but nominally compared to prior circuits). Having the precharge transistor stay substantially the same size reduces the overall area that the circuit uses.

Having illustrated and described the principles of the invention in a preferred embodiment, it should be apparent to those skilled in the art that the embodiment can be modified in arrangement and detail without departing from such principles.

Additionally, although the positive and negative voltage supplies are shown as ground and a standard digital power supply (i.e., 5 volts), other voltage supplies with different voltage levels can be used.

Moreover the illustrated circuits can be physically implemented, as in an operating circuit, or the circuits can be a symbolic representation, such as that generated on computer. Typically, when generated on a computer, a netlist is created for fabrication from the symbolic representation.

The word "between" as used herein should not be interpreted as limited to a direct connection, unless specified as a direct connection. A direct connection means not having any electronic components therebetween.

"Charging", as defined herein, refers to substantially equalizing the energy potential on the node (or logic block) being charged to the voltage source supplying the charge. Typically, the energy potential on the node is not identical to that of the source because of a voltage drop along the transmission line or through a transistor.

When a transistor is "activated" as used herein, it means that the transistor is fully turned ON (running near or at saturation). "Deactivated" means the transistor is fully turned OFF (although there is always some leakage current). These terms are not meant to include when a transistor is in a transition state switching between ON to OFF, or OFF to ON.

Furthermore, although the precharge and evaluation transistors are shown as single transistors, they may be implemented as transmission gates.

In view of the many possible embodiments to which the principles or invention may be applied, it should be recognized that the illustrated embodiment is only a preferred example of the invention and should not be taken as a limitation on the scope of the invention. Rather, the invention is defined by the following claims. We therefore claim as the invention all such embodiments that come within the scope of these claims.

We claim:

1. A dynamic logic circuit, comprising:
   a first transistor having a gate and a source-to-drain path, the source-to-drain path for charging a precharge node to a predetermined voltage level;
   a second transistor having a gate and a source-to-drain path directly connected to the source-to-drain path of the first transistor;
   a delay component directly connected to the gate of the first transistor; and
   a logic block directly connected to the source-to-drain path of the second transistor, the logic block providing the logical function of the circuit.

2. The dynamic logic circuit of claim 1 further including an anti-float device coupled to the precharge node for sustaining the precharge node at a defined voltage level and for providing a first output of the dynamic logic circuit.

3. The dynamic logic circuit of claim 2 further including a second output of the dynamic logic circuit directly connected to the precharge node.

4. The dynamic logic circuit of claim 1 further including a clock signal node directly connected to the delay and the second transistor for receiving a clock signal.

5. The dynamic logic circuit of claim 4 further including a buffer coupled to the clock signal node for providing an output clock from the dynamic logic circuit.

6. The dynamic logic circuit of claim 1 wherein the delay includes at least one inverter.

7. The dynamic logic circuit of claim 1 wherein the delay includes a transmission gate.

8. The dynamic logic circuit of claim 1 wherein the delay includes at least one resistor and at least one capacitor.

9. The dynamic logic circuit of claim 1 wherein the delay includes at least one buffer.

10. The dynamic logic circuit of claim 1 further including:
    a clock signal node coupled to the delay and the gate of the second transistor for receiving a clock signal;
    wherein one of the first and second transistors is activated with a low-voltage level applied to its gate and the other of the first and second transistors is activated with a high-voltage level applied to its gate; and
    wherein the delay delays the clock signal for a period of time sufficient to allow both the first and second transistors to be activated for the period of time caused by the delay.

11. A dynamic logic circuit, comprising:
    clock means for establishing timing of a precharge phase and an evaluation phase of the dynamic logic circuit;
    precharge means for charging a precharge node to a predetermined voltage level during the precharge phase;
    logic means for providing a logical function of the dynamic logic circuit;
    evaluation means between the precharge means and the logic means for allowing charge to flow between the precharge node and the logic means during the evaluation phase;
    means for delaying the clock means so that a leading edge of a clock cycle is received by the evaluation means before the precharge means.

12. The dynamic logic circuit of claim 11, wherein the clock means includes means for providing a buffered clock output from the dynamic logic circuit.

13. The dynamic logic circuit of claim 11 further including means for preventing the precharge node from floating to an indeterminate state.

14. The dynamic logic circuit of claim 11 further including output means for providing an inverted output and a non-inverted output.

15. A dynamic logic circuit, comprising:
    precharge and evaluation transistors that are activated and deactivated in response to an alternating clock signal and wherein one of the precharge and evaluation transistors is deactivated with the clock at a high-voltage level while the other is activated, and when the clock switches to a low-voltage level, both the precharge and evaluation transistors switch states; and
    a delay including an electrical component coupled to the precharge transistor, the electrical component for delaying the clock signal a predetermined period of time so that during the period of time both the evaluation and precharge transistors are activated.

16. The dynamic logic circuit of claim 15 further including a logic block coupled to the evaluation transistor and isolated from the precharge transistor, the logic block including input transistors for receiving input signals.

17. The dynamic logic circuit of claim 15 wherein the delay is selected from a group consisting essentially of an RC circuit, a transmission gate, an inverter a buffer, and combinations thereof.

18. The dynamic logic circuit of claim 15 further including a buffered output clock signal coupled to the delay for supplying the clock to other stages of dynamic logic circuits.

19. The dynamic logic circuit of claim 15 wherein the delay delays the clock signal to the precharge transistor by between 30 and 200 picoseconds.

20. The dynamic logic circuit of claim 15 further including a logic block having input transistors for receiving input signals and the dynamic logic circuit uses substantially constant power independent of the number of input transistors.

* * * * *